(12) United States Patent
Yano et al.

(10) Patent No.: US 12,289,390 B2
(45) Date of Patent: Apr. 29, 2025

(54) TIME SYNCHRONIZATION DEVICE AND NETWORK

(71) Applicant: National Institute of Information and Communications Technology, Tokyo (JP)

(72) Inventors: Yuichiro Yano, Tokyo (JP); Tetsuya Ido, Tokyo (JP); Motoaki Hara, Tokyo (JP)

(73) Assignee: National Institute of Information and Communications Technology, Tokyo (JP)

( * ) Notice: Subject to any disclaimer, the term of this patent is extended or adjusted under 35 U.S.C. 154(b) by 84 days.

(21) Appl. No.: 18/553,039

(22) PCT Filed: Feb. 25, 2022

(86) PCT No.: PCT/JP2022/007802
§ 371 (c)(1),
(2) Date: Sep. 28, 2023

(87) PCT Pub. No.: WO2022/209479
PCT Pub. Date: Oct. 6, 2022

(65) Prior Publication Data
US 2024/0195601 A1 Jun. 13, 2024

(30) Foreign Application Priority Data
Apr. 2, 2021 (JP) ................................. 2021-063282

(51) Int. Cl.
*H04L 7/00* (2006.01)
*H03L 7/099* (2006.01)
*H04L 7/033* (2006.01)

(52) U.S. Cl.
CPC ............ *H04L 7/033* (2013.01); *H03L 7/0992* (2013.01)

(58) Field of Classification Search
CPC ...... H04L 7/033; H03L 7/0992; H04J 3/0667; H04J 3/0697
(Continued)

(56) References Cited

U.S. PATENT DOCUMENTS

| 9,112,629 B2 * | 8/2015 | Ruffini | H04J 3/0679 |
| 10,205,586 B2 * | 2/2019 | Paul | H04J 3/0697 |

(Continued)

FOREIGN PATENT DOCUMENTS

| JP | 2014147105 A | 8/2014 |
| WO | 2015049479 A1 | 4/2015 |

OTHER PUBLICATIONS

"What is GNSS", Geospatial Information Authority of Japan, [online] (retrieved and archived from https://terras.gsi.go.jp/geo_info/GNSS.html by Internet Archive on Oct. 23, 2020.
(Continued)

*Primary Examiner* — Phuong Phu
(74) *Attorney, Agent, or Firm* — GRUMBLES LAW PLLC; Brittany Haanan

(57) ABSTRACT

A node includes: a communication module that recovers a clock signal of another node; a high-precision clock module; a first phase/frequency comparison module; a time estimation section that estimates time information of each node; a counter value correction section that corrects a counter value; a fractional PLL; a second phase/frequency comparison module; and a division ratio correction section that corrects a division ratio of the fractional PLL.

7 Claims, 6 Drawing Sheets

(58) Field of Classification Search
USPC .................................. 375/356, 373, 375, 376
See application file for complete search history.

(56) References Cited

U.S. PATENT DOCUMENTS

| | | | | |
|---|---|---|---|---|
| 10,652,007 | B2* | 5/2020 | Ito | .......................... H04J 3/0667 |
| 2009/0276542 | A1 | 11/2009 | Aweya et al. | |
| 2023/0319746 | A1* | 10/2023 | Hara | ........................ G04G 5/00 |
| | | | | 370/350 |

OTHER PUBLICATIONS

"What is NTP", Japan Network Information Center, [online] (retrieved and archived from https://www.nic.ad.jp/ja/basics/terms/ntp.html by Internet Archive on Mar. 15, 2021.
International Search Report and Written Opinion pertaining to PCT/JP2022/007802, mailed May 17, 2022.

* cited by examiner

TIME SYNCHRONIZATION DEVICE AND NETWORK

CROSS-REFERENCE TO RELATED APPLICATIONS

This is a National Stage Application of PCT Application No. PCT/JP2022/007802, filed Feb. 25, 2022, which claims priority to Japanese Patent Application No. 2021-063282, filed Apr. 2, 2021. The contents of these applications are incorporated herein by reference in their entirety.

TECHNICAL FIELD

The present invention relates to a time synchronization device and a network that perform time synchronization.

BACKGROUND ART

Currently, to ensure the simultaneity of nodes, schemes using wired lines, such as Network Time Protocol (NTP), Precision Time Protocol (PTP), and WhiteRabbit and schemes using wireless lines, such as Global Navigation Satellite System (GNSS) have been proposed (see Non-Patent Literatures 1 and 2).

NTP and PTP is capable of providing time information to a large number of nodes with a simple configuration. WhiteRabbit is capable of providing precise time information with a high accuracy of several nanoseconds between nodes with a dedicated IC implemented in hardware. GSNN is capable of providing precise time information with a high accuracy of several tens of microseconds by receiving radio waves from satellites.

CITATION LIST

Non-Patent Literature

Non-Patent Literature 1: "What is NTP", Japan Network Information Center, [online] [retrieved on Mar. 15, 2021], Internet <URL:https://www.nic.ad.jp/ja/basics/terms/ntp.html>

Non-Patent Literature 2: "What is GNSS", Geospatial Information Authority of Japan, [online] [retrieved on Mar. 15, 2021], Internet <URL:https://terras.gsi.go.jp/geo_info/GNSS.html>

SUMMARY OF THE INVENTION

Technical Problem

However, NTP and PTP are communication protocol schemes in the application layer and thus are difficult to perform precise time synchronization. WhiteRabbit requires a dedicated IC in each node and will be complicated to provide time to a large number of nodes due to the master-slave relationship. GNSS is vulnerable to antenna failure, deterioration of the radio wave environment due to solar wind, and jammer, and it is difficult to ensure reliability with GNSS.

In view of this, it is an object of the present invention to provide a time synchronization device and a time synchronization network with high-precision and high-reliability time synchronization.

Means for Solving the Problem

To achieve the above-mentioned problems, a time synchronization device according to the present invention is a time-estimating time synchronization device configured to time-synchronize with at least one non-time-estimating time synchronization device, the time-estimating time synchronization device including: a communication section configured to receive data from the at least one non-time-estimating time synchronization device and recover a clock signal included in the received data; a clock section configured to generate a clock signal of the time-estimating time synchronization device and count the generated clock signal; and a first frequency comparison section configured to generate frequency difference information on a difference between a frequency of the time-estimating time synchronization device and a frequency of the at least one non-time-estimating time synchronization device by comparing a frequency of the clock signal generated by the clock section and a frequency of the clock signal recovered by the communication section, a time estimation section configured to estimate, by maximum likelihood estimation processing, time information of the time-estimating time synchronization device and time information of the at least one-non-time-estimating time synchronization device based on the frequency difference information generated by the first frequency comparison section; a counter value correction section configured to correct a counter value of the clock section based on the time information of the time-estimating time synchronization device estimated by the time estimation section; a phase synchronization section configured to perform phase synchronization using the clock signal generated by the clock section; a second frequency comparison section configured to compare the frequency of the clock signal generated by the clock section and a frequency of a clock signal of the phase synchronization section; and a division ratio correction section configured to correct a division ratio of the phase synchronization section based on a result of the comparison by the second frequency comparison section.

To achieve the above-mentioned problems, a time synchronization device according to the present invention is a non-time-estimating time synchronization device configured to time-synchronize with a time-estimating time synchronization device, the non-time-estimating time synchronization device and the time-estimating time synchronization device being ones of a plurality of time synchronization devices, the non-time estimating time synchronization device including: a communication section configured to receive data from at least one of the plurality of time synchronization devices and recover a clock signal included in the received data; a clock section configured to generate a clock signal of the non-time-estimating time synchronization device and count the generated clock signal; and a first frequency comparison section configured to generate frequency difference information on a difference between a frequency of the non-time estimating time synchronization device and a frequency of the at least one of the plurality of time synchronization devices by comparing a frequency of the clock signal generated by the clock section and a frequency of the clock signal recovered by the communication section, a frequency difference information transmission section configured to transmit the frequency difference information to the time-estimating time synchronization device; a counter value correction section configured to correct a counter value of the clock section based on time information of the non-time-estimating time synchronization device, which time information has been estimated and transmitted to the non-time-estimating time synchronization device by the time-estimating time synchronization device and received by the non-time-estimating time synchronization device; a phase synchronization section configured to perform phase synchronization using the clock signal generated by the clock section; a second frequency comparison section configured to compare the frequency of the clock signal generated by the clock section and a frequency of a clock signal of the phase synchronization section; and a division ratio correction section configured to correct a division ratio of the phase synchronization section based on a result of the comparison by the second frequency comparison section.

With these configurations, a node compares frequencies of clock signals using a physical layer based technique without using dedicated ICs rather than comparing times simply. In addition, the node does not use radio waves from satellites as GNSS does and thus is not susceptible to deterioration of radio wave environment and jammer. Therefore, the node embodies a simple configuration and improves the precision and reliability of time synchronization.

It should be noted that the present invention can be embodied with a network constructed with the above-described time synchronization devices.

Advantageous Effects of the Invention

With the present invention, it is possible to provide a time synchronization device and a time synchronization network with high-precision and high-reliability time synchronization.

DESCRIPTION OF EMBODIMENTS

Hereinbelow, a description will be given of an embodiment of the present invention with reference to the drawings. It should be noted that the embodiments described below are those that embody the technical idea of the present invention. The present invention is not limited to those described below unless specific statements are given. It should also be noted that the same means is given the same reference sign and description thereof may be omitted.

Overall Configuration of Network

A description will be given of an overall configuration of a network 1 according to the embodiment with reference to FIG. 1.

The network 1 is constituted of a plurality of nodes (time synchronization devices) 2. Each of the nodes 2 performs communication while performing time synchronization. Here, in the network 1, adjacent nodes 2 are connected via a wired communication line or a wireless communication line in many-to-one relations, and both one-way communication and two-way communication are possible. In addition, in the network 1, each of the node 2 performs time synchronization using a physical layer based technique as described later.

Figure 1:
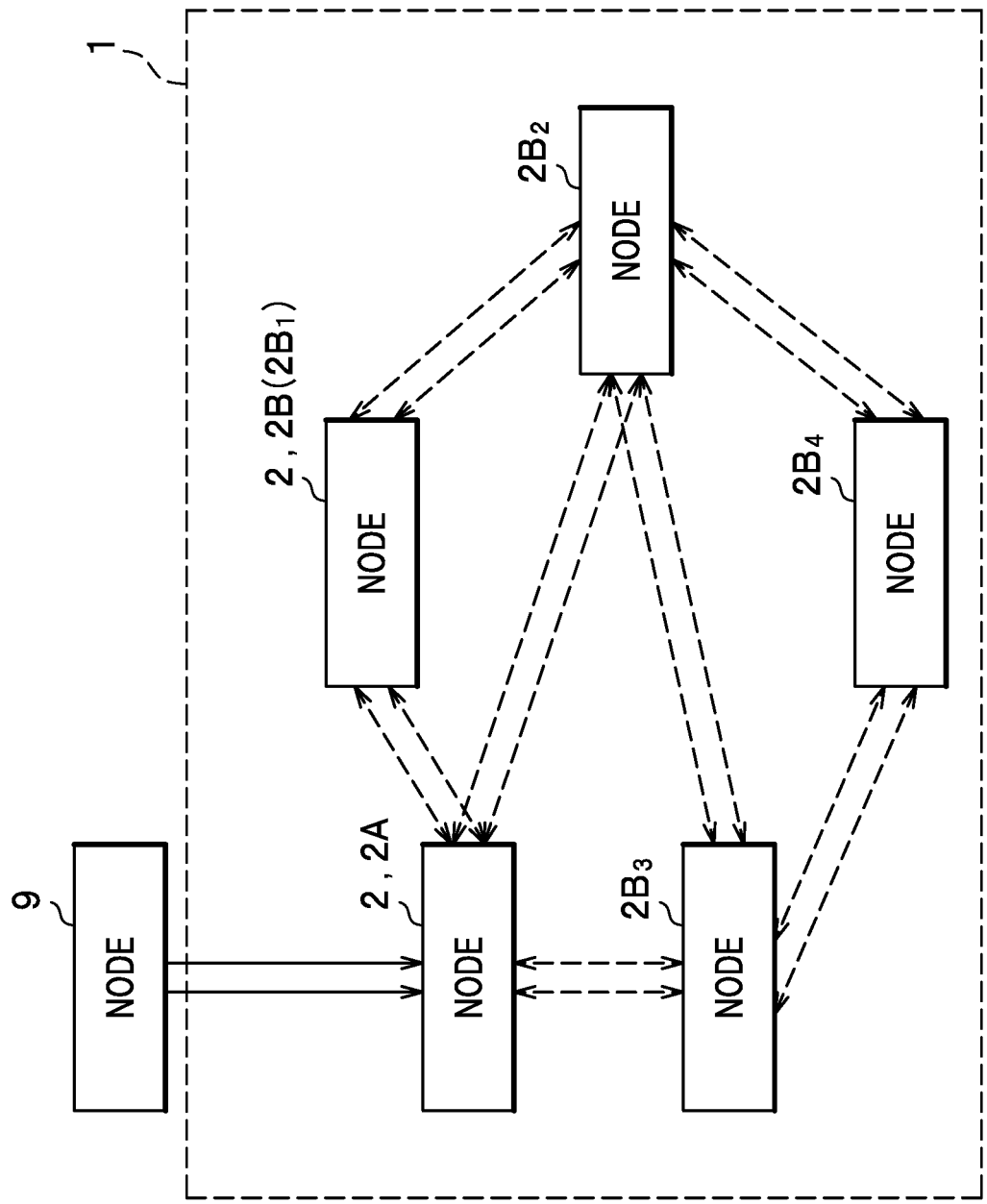
FIG. 1 is a schematic configuration diagram of a network according to an embodiment.

As illustrated in FIG. 1, the network 1 includes at least one node 2A that estimates time information. In the example illustrated in FIG. 1, the network 1 is constructed of a total of five nodes 2 including the one node 2A, which estimates time information, and four nodes 2B ($2B_1$-$2B_4$) that do not estimate time information. The node 2A is connected to the nodes $2B_1$-$2B_3$ but not to the node $2B_4$. In addition, the node 2A is also connected to a node 9 (e.g., absolute time source) belonging to another network and performs one-way communication with this node 9. In addition, the nodes $2B_1$-$2B_4$ have the same configuration.

The nodes 2 each communicate data while performing time synchronization with another node using information on the difference between the frequency of the self-node and the frequency of the other node. Examples of the nodes 2 include computers and mobile terminals which are each equipped with an atomic clock, such as chip-scale atomic clocks and compact light clocks, and a molecular clock.

It should be noted that the term "self-node (the time synchronization device)" means the node 2 itself and the term "another node (another time synchronization device)" means a node 2 other than the node 2.

In addition, the node 9 is a general node not belonging to the network 1 and therefore detailed description thereof is omitted.

Configuration of Node that Estimates Time Information

Figure 2:
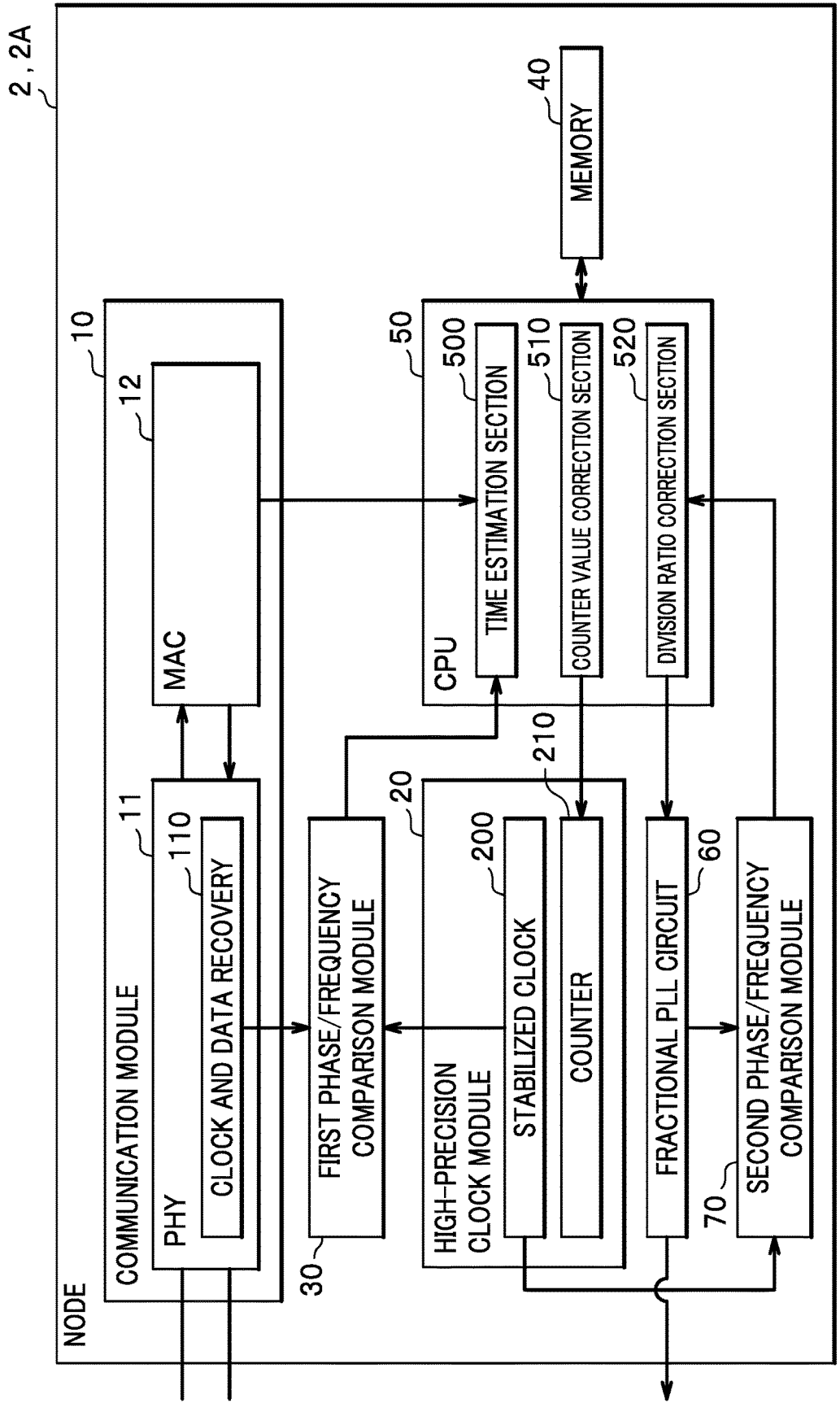
FIG. 2 is a block diagram illustrating the configuration of a node that estimates time information in the embodiment.

Referring to FIG. 2, a description will be given of the configuration of the node 2A, which estimates time information.

The node 2A is a node that estimates time information of the self-node, time information of another node connected to the self-node, and time information of another node not connected to the self-node. Hereinafter, another node connected to the self-node is sometimes abbreviated as "connected node" and another node not connected to the selfnode is sometimes abbreviated as "unconnected node".

As illustrated in FIG. 2, the node 2A includes: a communication module (communication section) 10; a high-precision clock module (clock section) 20; a first phase/frequency comparison module (first frequency comparison section) 30; a memory 40; a Central Processing Unit (CPU) 50 a fractional PLL circuit (phase synchronization section) 60; and a second phase/frequency comparison module (second frequency comparison section) 70.

The communication module 10 communicates with connected nodes (e.g., nodes $2B_1$-$2B_3$). The communication module 10 receives data from a connected node and recovers a clock signal included in the received data.

In addition, the communication module 10 requests another node for frequency difference information. For example, the communication module 10 requests for the frequency difference information when the below-described counter 210 has counted for a preset number of times. Here, when the network 1 is in an initial state, the communication module 10 broadcasts a request for frequency difference information to all the nodes 2 in the network 1. On the other hand, when the network 1 has been constructed, the communication module 10 requests the connected nodes for frequency difference information. Further, the communication module 10 requests for frequency difference information of an unconnected node to a connected node (e.g., node $2B_3$) located adjacent to the unconnected node.

After that, the communication module 10 receives frequency difference information from another node in response to the request for frequency difference information, and writes the received frequency difference information via CPU 50 or by Direct Memory Access (DMA) to the memory 40.

As illustrated in FIG. 2, the communication module 10 includes a Physical Layer (PHY) 11 and a Medium Access Controller (MAC) 12.

The PHY 11 is an implementation of the functions of the physical layer and connects the MAC 12 to a wired communication line or a wireless communication line. The PHY 11 includes a clock and data recovery (CDR) 110.

The clock and data recovery 110 recovers a clock signal included in the data received from a connected node (e.g., node $2B_1$-$2B_3$). For example, the clock and data recovery 110 recovers the clock signal using a Phase Locked Loop (PLL) circuit or an interpolator. This recovered clock signal is in phase synchronization with the connected node. Then, the clock and data recovery 110 outputs the recovered clock signal of the connected node to a first phase/frequency comparison module 30.

The MAC 12 controls communication with connected nodes, and is a general one. For example, the MAC 12 outputs to the CPU 50 the data received by the communication module 10 (the data include frequency difference information about the node $2B_4$, which is an unconnected node).

The high-precision clock module 20 generates a clock signal of the self-node and counts the generated clock signal. As illustrated in FIG. 2, the high-precision clock module 20 includes a stabilized clock 200 and a counter 210.

Examples of the stabilized clock 200 include an atomic clock, such as chip-scale atomic clocks that generates a clock signal of the self-node and compact light clocks, and a molecular clock. The stabilized clock 200 outputs the generated clock signal of the self-node to the first phase/frequency comparison module 30 and to a second phase/frequency comparison module 70.

The counter 210 is a general counter that counts the number of clocks in the clock signal generated by the stabilized clock 200. In addition, the counter 210 alters the counter value thereof according to an instruction from the below-described counter value correction section 510.

The first phase/frequency comparison module 30 compares the frequency of the clock signal of the communication module 10 and the frequency of the clock signal of the high-precision clock module 20, thereby to generate information on the difference between the frequency of the self-node and the frequency of the connected node. In other words, the first phase/frequency comparison module 30 finds a difference between the frequency of the clock signal of the self-node input from the stabilized clock 200 and the frequency of the clock signal of the connected node inputted form the clock and data recovery 110, and then generates the frequency difference information. Examples of the first phase/frequency comparison module 30 include a Dual Mixer Time Difference System (DMTD). The first phase/frequency comparison module 30 writes the generated frequency difference information into the memory 40 via the CPU 50 or by DMA.

The memory 40 is a storage device, such as a Hard Disk Drive (HDD) and a Solid State Drive (SSD), that store frequency difference information of a predetermined period of time (e.g., 0.1-1.0 seconds).

The CPU 50 performs various calculations in the node 2A and includes a time estimation section 500, a counter value correction section 510, and a division ratio correction section 520.

The time estimation section 500 estimates, by maximum likelihood estimation processing, time information of each node 2 (node 2A and nodes $2B_1$-$2B_4$) based on the frequency difference information stored in the memory 40. In the case of the present embodiment, the time estimation section 500 uses a Kalman filter as the maximum likelihood estimation processing.

Estimation of Time Information

Hereinbelow, the estimation of time information by the time estimation section 500 will be specifically described.

As a delay occurs when transmitting the frequency difference information from the nodes 2B to the node 2A, it is desirable to use frequency difference information of the same time so as to reduce the effect of the delay. In this regard, the counter value of the clock signal is usable as information indicative of the time of each node 2. In view of this, the communication module 10 receives the counter value of the node 2B together with the frequency difference information about the node 2B, and writes the received frequency difference information and the counter value into the memory 40. Then, the time estimation section 500 references the counter values representing the reception times of the frequency difference information, and estimates the time information of each node 2 based on the frequency difference information of the same time using the Kalman filter.

The Kalman filter is constituted of a state equation (1) that describes internal states and an observation equation (2) that describes observed values, and estimates a most probable internal state x(t) based on the actually observed values. In the case of the present embodiment, the internal state x(t) represents the time information of each node 2 and the actually observed values represent frequency difference information. Therefore, the time estimation section 500 can estimate the time information of each node 2 by solving the equation (1) and the equation (2) Here, v(t) represents a system noise; w(t) represents an observation noise; $f_i(t)$−$f_j(t)$ represents the difference between the frequencies of the clock signals of the nodes $2_i$ and $2_j$, where i≠j≥1.

Math 1

$$\dot{x}(t)=Ax(t)+Bv(t) \quad (1)$$

$$y(t)=f_i(t)-f_j(t)+w(t) \quad (2)$$

Returning to FIG. 2, description of the node 2A continues.

The counter value correction section 510 corrects the counter value of the high-precision clock module 20 based on the time information of the self-node estimated by the time estimation section 500. Specifically, the counter value correction section 510 corrects the counter value of the counter 210 so that the counter value coincides with the time of the node 2A estimated by the time estimation section 500.

The division ratio correction section 520 corrects the division ratio of a fractional PLL circuit 60 based on the result of the comparison by the below-described second phase/frequency comparison module 70. Specifically, the division ratio correction section 520 corrects the division ratio of the fractional PLL circuit 60 so that the comparison result input from the second phase/frequency comparison module 70 coincides with the counter value corrected by the counter value correction section 510

The fractional PLL circuit 60 performs phase synchronization using the clock signal generated by the high-precision clock module 20. In addition, the fractional PLL circuit 60 alters the division ratio thereof based on the instruction from the division ratio correction section 520.

The node 2A may, upon an inquiry of the time from the outside such as another node, digitally output the clock signal generated by the fractional PLL circuit 60 as the time information of the node 2A. On the other hand, when the node 2A provides high-precision time information to a measurement device such as spectrum analyzers and oscilloscopes, the node 2A may output the counter value of the counter 210 in an analog format as the time information of the node 2A.

The second phase/frequency comparison module 70 compares the frequencies of the clock signals of the high-precision clock module 20 and the fractional PLL circuit 60. In other words, the second phase/frequency comparison module 70 finds a difference between the frequency of the clock signal inputted from the stabilized clock 200 and the frequency of the clock signal inputted from the fractional PLL circuit 60. Examples of the second phase/frequency comparison module 70 include a DMTD. The second phase/frequency comparison module 70 outputs the found frequency difference to the division ratio correction section 520 as the comparison result.

Configuration of Node that does not Estimate Time Information

Figure 3:
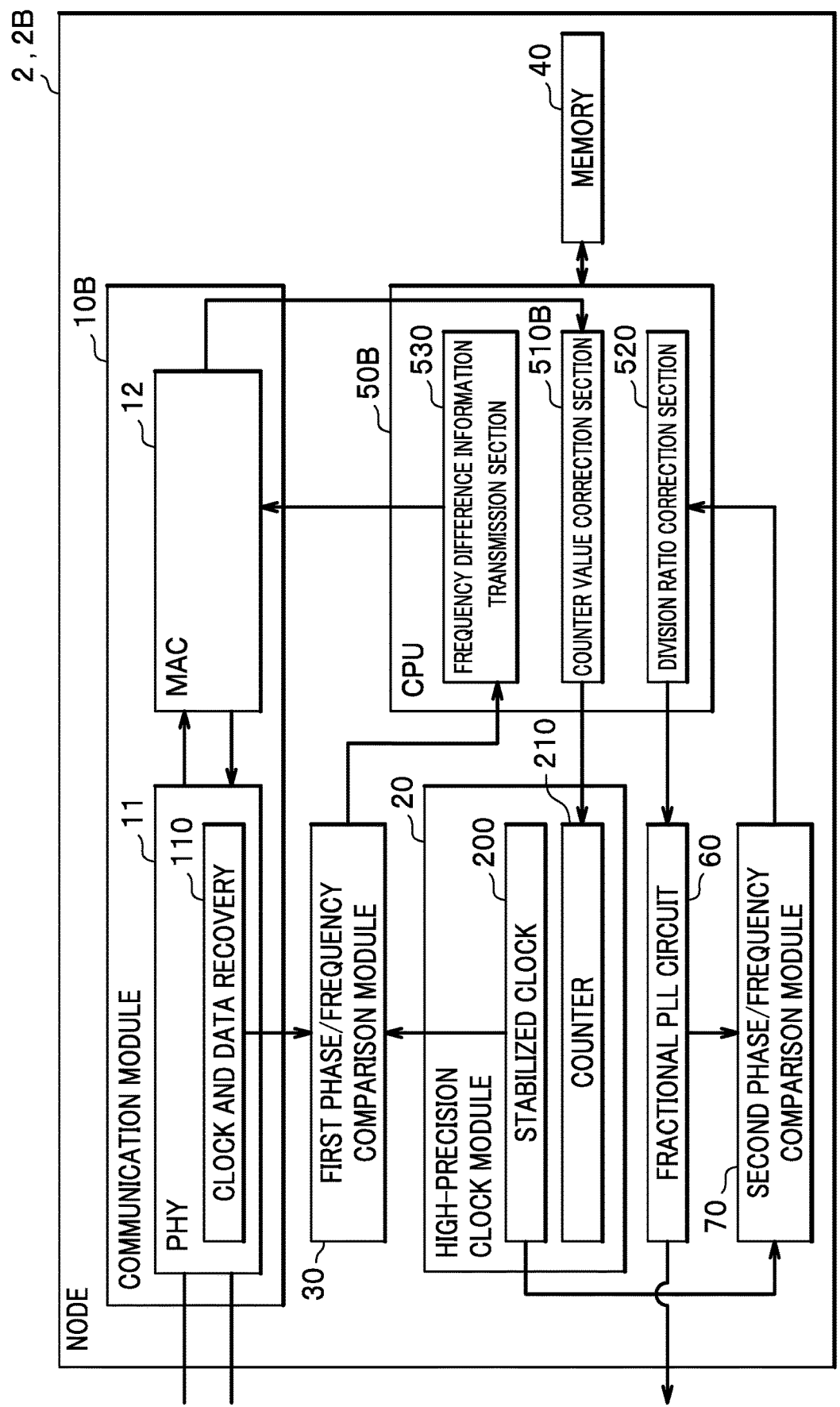
FIG. 3 is a block diagram illustrating the configuration of a node that does not estimate time information in the embodiment.

With reference to FIG. 3, the configuration of the nodes 2B, which do not estimate the time information, will be described with respect to the differences from the node 2A.

The nodes 2B are nodes that perform time synchronization using the time information estimated by the node 2A. In the example illustrated in FIG. 1, each of the nodes 2B generates, in response to a request form the node 2A, frequency difference information on the difference between the frequencies of the self-node and another node, and transmits the generated frequency difference information to the node 2A. The node 2B performs time synchronization using the time information of the node 2B received from the node 2A.

As illustrated in FIG. 3, the node 2B includes: a communication module (communication section) 10B; a high-precision clock module 20; a first phase/frequency comparison module 30; a memory 40; a CPU 50B; a fractional PLL circuit 60; and a second phase/frequency comparison module 70. Note that as the components other than the communication module 10B and the CPU 50B are the same as those of the node 2A illustrated in FIG. 2, descriptions thereof are omitted.

The communication module 10B transmits frequency difference information to the node 2A and receives time information from the node 2A. At this time, the communication module 10B may transmit the counter value of the counter 210 together with the frequency difference information.

The communication module 10B controls the timing of the transmission of the frequency difference information to the node 2A. Specifically, the communication module 10B controls the transmission to transmit the frequency difference information continuously or intermittently. For example, in a normal mode of wired serial communication, the communication module 10B transmits the frequency difference information continuously. On the other hand, the communication module 10B, upon establishment of a link of the communication module 10B, transmits the frequency difference information, and when in a resting mode or in a power saving mode, interrupts the transmission of the frequency difference information (intermittent transmission).

As the other features of the communication module 10B are the same as those of the node 2A illustrated in FIG. 2, further description is omitted.

The CPU 50B performs various calculations in the node 2B and includes a frequency difference information transmission section 530; a counter value correction section 510B; and a division ratio correction section 520. As the division ratio correction section 520 is the same as that of the node 2A, description thereof is omitted.

The frequency difference information transmission section 530 transmits frequency difference information to the node 2A, which estimates time information. Specifically, upon a request from the node 2A for frequency difference information, the frequency difference information transmission section 530 transmits the frequency difference information to the node 2A via the communication module 10B.

The counter value correction section 510B corrects the counter value of the high-precision clock module 20 based on the time information of the self-node, received from the node 2A that estimate the time information. That is, the counter value correction section 510B corrects the counter value of the counter 210 so that the counter value coincides with the time of the node 2B estimated by the node 2A.

Transmission and Reception of Frequency Difference Information and Time Information Transmission and reception of frequency difference information and time information between the node 2A, which estimates time information, and the nodes 2B, which do not estimate time information, will be described with reference to FIG. 1.

In the example illustrated in FIG. 1, the node 2A generates, by the first phase/frequency comparison module 30, frequency difference information on the difference between the frequencies of the node 2A and the node $2B_1$, frequency difference information on the difference between the frequencies of the node 2A and the node $2B_2$, and frequency difference information on the difference between the frequencies of the node 2A and the node $2B_3$. In addition, the node $2B_1$ generates, by the first phase/frequency comparison module 30, frequency difference information on the difference between the frequencies of the node $2B_1$ and the node 2A, and frequency difference information on the difference between the frequencies of the node $2B_1$ and the node $2B_2$ (the same applies to the node $2B_2$ and the node $2B_3$). In addition, the node $2B_4$ generates, by the first phase/frequency comparison module 30, frequency difference information on the difference between the frequencies of the node $2B_4$ and the node $2B_2$, and frequency difference information on the difference between the frequencies of the node $2B_4$ and the node $2B_3$.

The node 2A requests the node $2B_1$ for frequency difference information by the communication module 10. In response to this request, the node $2B_1$ transmits, by the frequency difference information transmission section 530, frequency difference information on the difference between the frequencies of the node $2B_1$ and the node 2A and frequency difference information on the difference between the frequencies of the node $2B_1$ and the node $2B_2$ to the node 2A (the same applies to the node $2B_2$ and the node $2B_3$).

Next, the node 2A requests for frequency difference information of the node $2B_4$ via the node $2B_3$ located adjacent to the node $2B_4$, by the communication module 10. In response to this request, the node $2B_4$ transmits, by the frequency difference information transmission section 530, frequency difference information on the difference between the frequencies of the node $2B_4$ and the node $2B_2$ and frequency difference information on the difference between the frequencies of the node $2B_4$ and the node $2B_3$ to the node 2A via the node $2B_3$ located adjacent to the node $2B_4$.

Next, the node 2A estimates, by the time estimation section 500, time information of each of the node 2A and the nodes $2B_1$-$2B_4$, using each frequency difference information. Then, the node 2A transmits the estimated time information of the nodes $2B_1$-$2B_4$ to the nodes $2B_1$-$2B_4$.

Here, in the network 1, frequency difference information in the same segment is generated by different nodes 2. In the example illustrated in FIG. 1, the node 2A generates frequency difference information on the difference between the frequencies of the node 2A and the node $2B_1$, and the node $2B_1$ also generates frequency difference information on the difference between the frequencies of the node $2B_1$ and the node 2A. These pieces of frequency difference information of the same segment do not represent the same frequency difference but different frequency differences that coincide within some uncertainty range. Therefore, the node 2A may handle these pieces of frequency difference information of the same segment as separate pieces of frequency difference information to estimate the time information.

Operation of Node that Estimates Time Information

Operations of the node 2A, which estimates time information, will be described with reference to FIG. 4.

Figure 4:
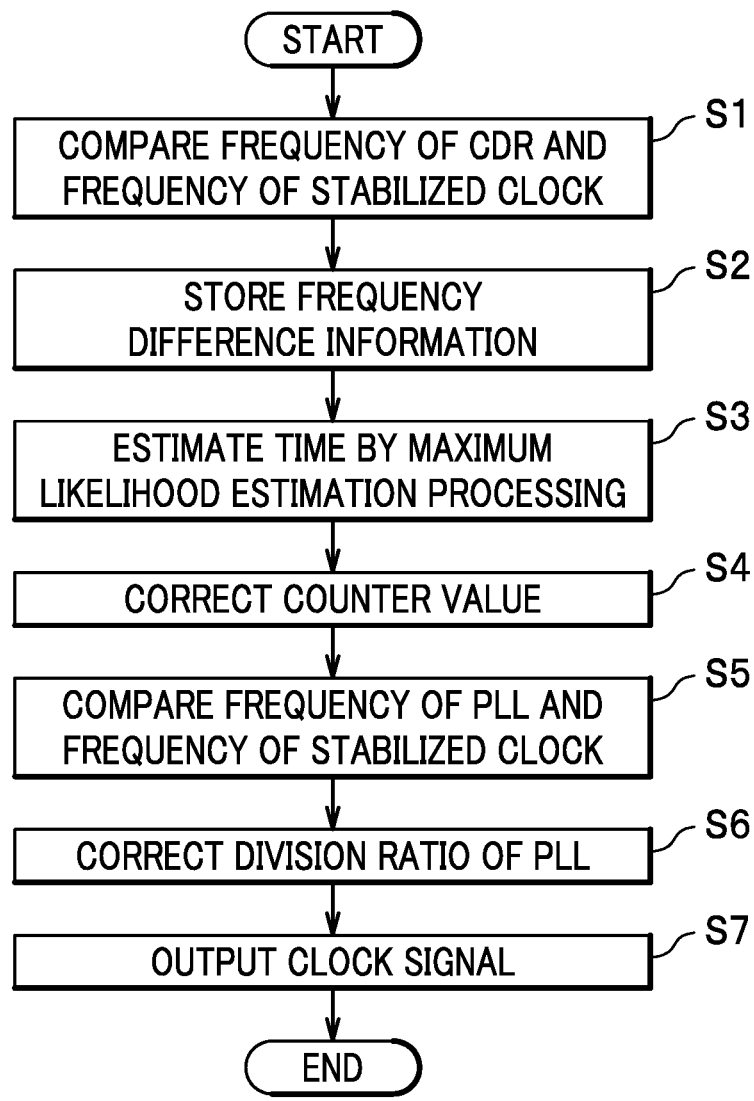
FIG. 4 is a flowchart illustrating operations of the node illustrated in FIG. 2.

As illustrated in FIG. 4, in step S1, the first phase/frequency comparison module 30 compares the frequencies of the clock signals of the stabilized clock 200 and the clock and data recovery 110 to generate frequency difference information. In addition, the communication module 10 requests for frequency difference information of the other nodes.

In step S2, the first phase/frequency comparison module 30 writes the frequency difference information into the memory 40, via the CPU 50 or by DMA. The memory 40 stores frequency difference information of a predetermined time period.

In step S3, the time estimation section 500 estimates, by maximum likelihood estimation processing, time information of each node 2 based on the frequency difference information stored in the memory 40. For example, the time estimation section 500 uses a Kalman filter as the maximum likelihood estimation processing.

In step S4, the counter value correction section 510 corrects the counter value of the high-precision clock module 20 based on the time information of the self-node estimated by the time estimation section 500.

In step S5, the second phase/frequency comparison module 70 compares the frequency of the clock signal of the stabilized clock 200 and the frequency of the clock signal of the fractional PLL circuit 60.

In step S6, the division ratio correction section 520 corrects the division ratio of the fractional PLL circuit 60 based on the result of the comparison by the second phase/frequency comparison module 70.

In step S7, the fractional PLL circuit 60 outputs the clock signal generated by this fractional PLL circuit 60, as the time information of the node 2A.

Operation of Node that does not Estimate Time Information

Operations of the node 2B, which does not estimate time information, will be described with reference to FIG. 5.

As the processing other than the steps from S2B to S4B is the same as that of FIG. 4, description thereof is omitted.

Figure 5:
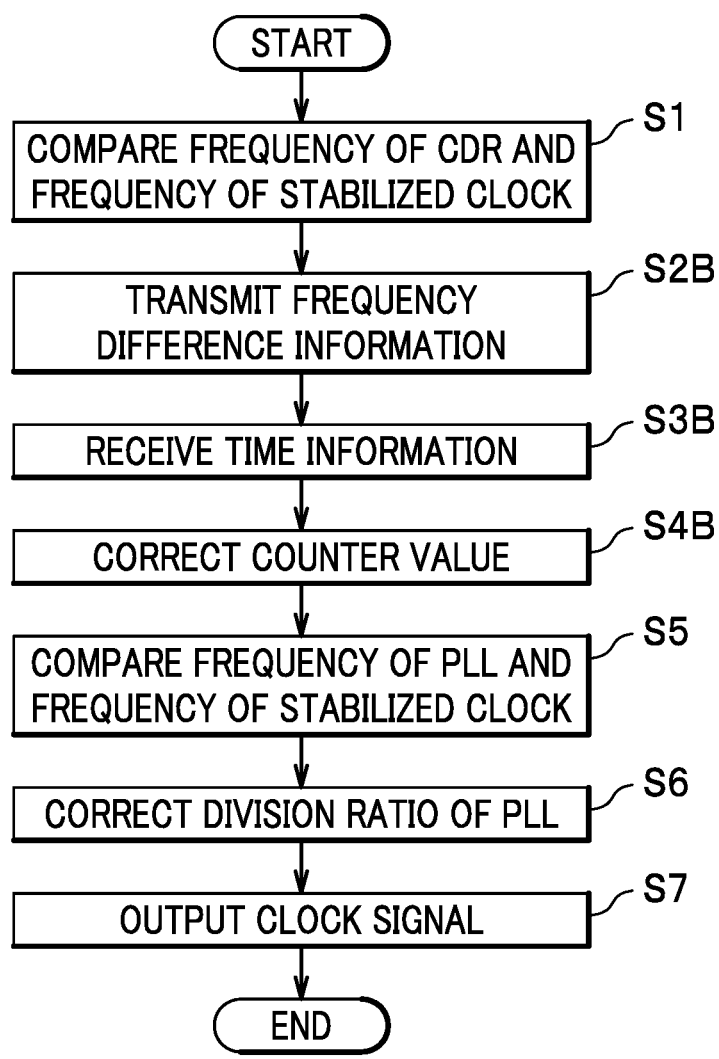
FIG. 5 is a flowchart illustrating operations of the node illustrated in FIG. 3.

As illustrated in FIG. 5, in step S2B, the frequency difference information transmission section 530 transmits, via the communication module 10B, the frequency difference information to the node 2A in response to the request form the node 2A.

In step S3B, the communication module 10B receives the time information from the node 2A.

In step S4B, the counter value correction section 510B corrects the counter value of the high-precision clock module 20 based on the time information of the self-node received by the communication module 10B.

It should be noted that the node 2A and the node 2B repeat the processing illustrated in FIGS. 4 and 5 when transmitting and receiving the frequency difference information continuously. On the other hand, when the node 2A and the node 2B perform transmission and reception of the frequency difference information intermittently, the node 2A and the node 2B perform the processing illustrated in FIGS. 4 and 5 at the timing where a link of the communication modules 10 and 10B have been established.

Working Effects

In the network 1 according to the embodiment, the nodes 2 compare the frequencies of clock signals using a physical layer based technique rather than simply comparing times, without using a dedicated IC. In addition, the nodes 2 do not use radio waves from satellites as GNSS does and thus are not susceptible to deterioration of radio wave environment and jammer. Therefore, the nodes 2 embody a simple configuration and improve the precision and reliability of time synchronization.

That is, as the network 1 do not use any dedicated IC, it is possible for a large number of nodes 2 assumed in the next generation communication to perform time synchronization. Therefore, the network 1 embodies a simple configuration and thus largely reduces the component cost and the cost for operation, maintenance, and management. In addition, as detection of abnormalities of the nodes 2 is made possible by collecting the frequency difference information between each node 2 and performing maximum likelihood estimation processing, the network 1 constructs a time synchronization network with higher reliability. In addition, when either of the nodes 2 is connected to an absolute time source, it is possible for the network 1 to perform more precise time synchronization by performing maximum likelihood estimation processing.

Embodiment Example

As an embodiment example, the accuracy of time synchronization by the nodes 2 will be described with reference to FIGS. 6 and 7.

Figure 6:
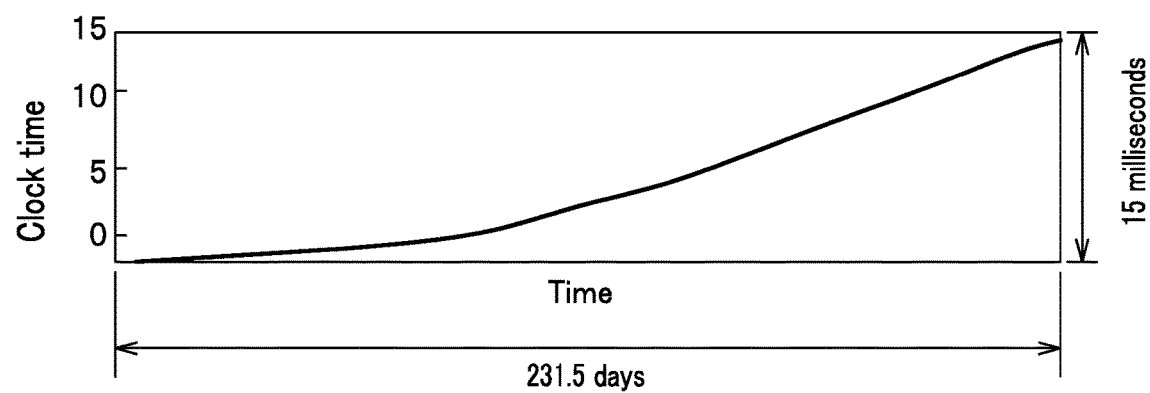
FIG. 6 is a graph illustrating a simulation result of a comparative example.
Figure 7:
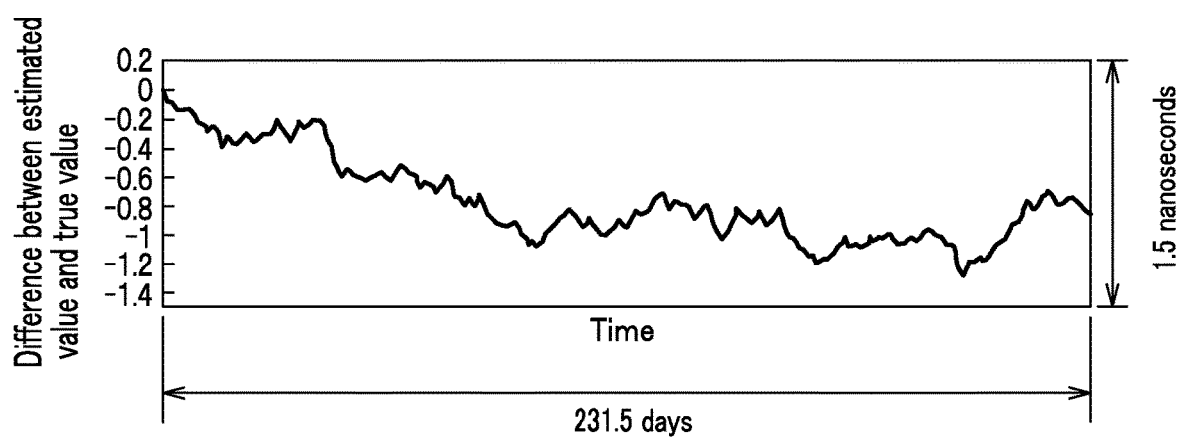
FIG. 7 is a graph illustrating a simulation result of an embodiment example.

FIG. 6 illustrates, as a comparative example, the result of simulation of the accuracy of time synchronization with respect to a conventional small atomic clock equipped with a chip-scale atomic clock. The vertical axis of FIG. 6 represents the time difference between the time ticked by a highly accurate virtual clock and the time ticked by the single atomic clock. FIG. 7 illustrates, as an embodiment example, the result of simulation of the accuracy of time synchronization by the nodes 2. The vertical axis of FIG. 7 represents the time difference between the time ticked by a single atomic clock and the time estimated by maximum likelihood estimation processing based on frequency difference information.

As shown in FIG. 6, in the case of the comparative example, an error of about 15 milliseconds from the ideal atomic clock time (absolute time) occurs after 231.5 days. On the other hand, as shown in FIG. 7, in the case of the embodiment example, by collecting frequency difference information based on the absolute frequency source, it was possible to estimate the time of the small atomic clock with high accuracy, and it was found that the error was within about 1.5 nanoseconds.

REFERENCE SIGNS LIST

1 Network
2, 2A, 2B, $2B_1$-$2B_4$ Node (time synchronization device)
9 Node
10, 10B Communication module (communication section)
11 PHY
12 MAC
20 High-Precision clock module (clock section)
30 First phase/frequency comparison module (first frequency comparison section)
40 Memory
50, 50B CPU
60 Fractional PLL circuit (phase synchronization section)
70 Second phase/frequency comparison module (second frequency comparison section)
110 Clock and data recovery
200 Stabilization clock
210 Counter
500 Time estimation section
510, 510B Counter value correction section
520 Division ratio correction section
530 Frequency difference information transmission section

The invention claimed is:

1. A time-estimating time synchronization device configured to time-synchronize with at least one non-time-estimating time synchronization device, the time-estimating time synchronization device comprising:
a communication section configured to receive data from the at least one non-time-estimating time synchronization device and recover a clock signal included in the received data;
a clock section configured to generate a clock signal of the time-estimating time synchronization device and count the generated clock signal; and
a first frequency comparison section configured to generate frequency difference information on a difference between a frequency of the time-estimating time synchronization device and a frequency of the at least one non-time-estimating time synchronization device by comparing a frequency of the clock signal generated by the clock section and a frequency of the clock signal recovered by the communication section,
a time estimation section configured to estimate, by maximum likelihood estimation processing, time information of the time-estimating time synchronization device and time information of the at least one non-time-estimating time synchronization device based on the frequency difference information generated by the first frequency comparison section;
a counter value correction section configured to correct a counter value of the clock section based on the time information of the time-estimating time synchronization device estimated by the time estimation section;
a phase synchronization section configured to perform phase synchronization using the clock signal generated by the clock section;
a second frequency comparison section configured to compare the frequency of the clock signal generated by the clock section and a frequency of a clock signal of the phase synchronization section; and
a division ratio correction section configured to correct a division ratio of the phase synchronization section based on a result of the comparison by the second frequency comparison section.

2. The time-estimating time synchronization device according to claim 1,
wherein the at least one non-time-estimating time synchronization device is one or a plurality of connected non-time-estimating time synchronization devices connected to the time-estimating time synchronization device,
wherein the one or a plurality of connected non-time-estimating time synchronization devices are one or more of one or a plurality of non-time-estimating time synchronization devices,
wherein the time-estimating time synchronization device and the one or a plurality of non-time-estimating time synchronization devices are members of a plurality of time synchronization devices,
wherein each of the one or a plurality of non-time-estimating time synchronization devices comprises:
a communication section configured to receive data from at least one of the plurality of time synchronization devices and recover a clock signal included in the data received by the communication section of the non-time-estimating time synchronization device;
a clock section configured to generate a clock signal of the non-time-estimating time synchronization device and count the clock signal generated by the clock section of the non-time-estimating time synchronization device; and
a first frequency comparison section configured to generate frequency difference information on a difference between a frequency of the non-time-estimating time synchronization device and a frequency of the at least one of the plurality of time synchronization devices by comparing a frequency of the clock signal generated by the clock section of the non-time-estimating time synchronization device and a frequency of the clock signal recovered by the communication section of the non-time-estimating time synchronization device,
wherein the communication section of the time-estimating time synchronization device is further configured to receive, from each of the one or a plurality of non-time-estimating time synchronization devices, the frequency difference information generated by the first frequency comparison section of the non-time-estimating time synchronization device,
wherein the first frequency comparison section of the time-estimating time synchronization device generates, for each of the one or a plurality of connected non-time-estimating time synchronization devices, frequency difference information on a difference between the frequency of the time-estimating time synchronization device and a frequency of the connected non-time-estimating time synchronization device, by comparing the frequency of the clock signal generated by the clock section of the time-estimating time synchronization device and a frequency of a clock signal having been recovered by the communication section of the time-estimating time synchronization device from data received from the connected non-time-estimating time synchronization device, and
wherein the time estimation section is further configured to estimate, by the maximum likelihood estimation processing, time information of each of the plurality of time synchronization devices based on: each frequency difference information on the difference between the frequency of the time-estimating time synchronization device and a frequency of each of the one or a plurality of connected non-time-estimating time synchronization devices, generated by the first frequency comparison section of the time-estimating time synchronization device; and each frequency difference information received by the communication section of the time-estimating time synchronization device.

3. The time-estimating time synchronization device according to claim 2,
wherein the communication section of the time-estimating time synchronization device is further configured to receive, from each of the one or a plurality of non-time-estimating time synchronization devices, a counter value of the clock signal generated by the clock section of the non-time-estimating time synchronization device together with the frequency difference information generated by the first frequency comparison section of the non-time-estimating time synchronization device, and
wherein the time estimation section is further configured to reference each received counter value and estimate the time information of each of the plurality of time synchronization devices based on, of each frequency difference information on the difference between the frequency of the time-estimating time synchronization device and the frequency of each of the one or a plurality of connected non-time-estimating time synchronization devices, generated by the first frequency comparison section of the time-estimating time synchronization device, and each frequency difference information received by the communication section of the time-estimating time synchronization device, information of the same time, using a Kalman filter.

4. A non-time-estimating time synchronization device configured to time-synchronize with a time-estimating time synchronization device, the non-time-estimating time synchronization device and the time-estimating time synchronization device being ones of a plurality of time synchronization devices, the non-time-estimating time synchronization device comprising:
a communication section configured to receive data from at least one of the plurality of time synchronization devices and recover a clock signal included in the received data;
a clock section configured to generate a clock signal of the non-time-estimating time synchronization device and count the generated clock signal; and
a first frequency comparison section configured to generate frequency difference information on a difference between a frequency of the non-time-estimating time synchronization device and a frequency of the at least one of the plurality of time synchronization devices by comparing a frequency of the clock signal generated by the clock section and a frequency of the clock signal recovered by the communication section,
a frequency difference information transmission section configured to transmit the frequency difference information to the time-estimating time synchronization device;
a counter value correction section configured to correct a counter value of the clock section based on time information of the non-time-estimating time synchronization device, which time information has been estimated and transmitted to the non-time-estimating time synchronization device by the time-estimating time synchronization device and received by the non-time-estimating time synchronization device;
a phase synchronization section configured to perform phase synchronization using the clock signal generated by the clock section;
a second frequency comparison section configured to compare the frequency of the clock signal generated by the clock section and a frequency of a clock signal of the phase synchronization section; and
a division ratio correction section configured to correct a division ratio of the phase synchronization section based on a result of the comparison by the second frequency comparison section.

5. The non-time-estimating time synchronization device according to claim 4,
wherein the communication section is further configured to transmit, to the time-estimating time synchronization device, the counter value together with the frequency difference information.

6. A network comprising a time-estimating time synchronization device and at least one non-time-estimating time synchronization device, the time-estimating time synchronization device and the at least one non-time-estimating time synchronization device being members of a plurality of time synchronization devices,
wherein each of the plurality of time synchronization devices comprises:
a communication section configured to receive data from at least one of the plurality of time synchronization devices and recover a clock signal included in the received data;
a clock section configured to generate a clock signal of the time synchronization device and count the generated clock signal; and
a first frequency comparison section configured to generate frequency difference information on a difference between a frequency of the time synchronization device and a frequency of the at least one of the plurality of time synchronization devices by comparing a frequency of the clock signal generated by the clock section and a frequency of the clock signal recovered by the communication section,
a phase synchronization section configured to perform phase synchronization using the clock signal generated by the clock section;
a second frequency comparison section configured to compare the frequency of the clock signal generated by the clock section and a frequency of a clock signal of the phase synchronization section; and
a division ratio correction section configured to correct a division ratio of the phase synchronization section based on a result of the comparison by the second frequency comparison section,
wherein the at least one non-time-estimating time synchronization device further comprises a frequency difference information transmission section configured to transmit the frequency difference information generated by the first frequency comparison section of the at least one non-time-estimating time synchronization device to the time-estimating time synchronization device,
wherein the communication section of the time-estimating time synchronization device is further configured to receive, from the at least one non-time-estimating time synchronization device, the frequency difference information generated by the first frequency comparison section of the at least one non-time-estimating time synchronization device, wherein the at least one non-time-estimating time synchronization device comprises one or a plurality of connected non-time-estimating time synchronization devices connected to the time-estimating time synchronization device, wherein the communication section of the time-estimating time synchronization device receives data from each of the one or a plurality of connected non-time-estimating time synchronization devices and recovers a clock signal included in the data received from the connected non-time-estimating time synchronization device, wherein the first frequency comparison section of the time-estimating time synchronization device generates, for each of the one or a plurality of connected non-time-estimating time synchronization devices, frequency difference information on a difference between a frequency of the time-estimating time synchronization device and a frequency of the connected non-time-estimating time synchronization device by comparing a frequency of the clock signal generated by the clock section of the time-estimating time synchronization device and a frequency of the clock signal recovered by the communication section of the time-estimating time synchronization device from the data received from the connected non-time-estimating time synchronization device, wherein the time-estimating time synchronization device further comprises:

a time estimation section configured to estimate, by maximum likelihood estimation processing, time information of each of the plurality of time synchronization devices based on each frequency difference information on the difference between the frequency of the time-estimating time synchronization device and the frequency of each of the one or a plurality of connected non-time-estimating time synchronization devices, generated by the first frequency comparison section of the time-estimating time synchronization device, and on each frequency difference information received by the communication section of the time-estimating time synchronization device; and a counter value correction section configured to correct a counter value of the clock section of the time-estimating time synchronization device based on the time information of the time-estimating time synchronization device estimated by the time estimation section, and wherein the at least one non-time-estimating time synchronization device further comprises a counter value correction section configured to correct a counter value of the clock section of the at least one non-time-estimating time synchronization device based on the time information of the at least one non-time-estimating time synchronization device estimated by the time estimation section of the time-estimating time synchronization device and transmitted by the time-estimating time synchronization device to the at least one non-time-estimating time synchronization device and received by the at least one non-time-estimating time synchronization device.

7. The network according to claim 6, wherein the communication section of the at least one non-time-estimating time synchronization devices is further configured to transmit, to the time-estimating time synchronization device, a counter value of the clock section of the at least one non-time-estimating time synchronization device together with the frequency difference information generated by the first frequency comparison section of the at least one non-time-estimating time synchronization device, wherein the communication section of the time-estimating time synchronization device is further configured to receive, from the at least one non-time-estimating time synchronization device, the counter value of the clock section of the at least one non-time-estimating time synchronization device together with the frequency difference information generated by the first frequency comparison section of the at least one non-time-estimating time synchronization device, wherein the time estimation section is further configured to reference each received counter value and estimate the time information of each of the plurality of time synchronization devices based on, of each frequency difference information on the difference between the frequency of the time-estimating time synchronization device and the frequency of each of the one or a plurality of connected non-time-estimating time synchronization devices, generated by the first frequency comparison section of the time-estimating time synchronization device, and on each frequency difference information received by the communication section of the time-estimating time synchronization device, information of the same time, using a Kalman filter.

* * * * *